United States Patent
Hayakawa

(10) Patent No.: US 6,278,151 B1
(45) Date of Patent: Aug. 21, 2001

(54) SEMICONDUCTOR DEVICE HAVING WIRING DETOUR AROUND STEP

(75) Inventor: Tsutomu Hayakawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/097,667

(22) Filed: Jun. 16, 1998

(30) Foreign Application Priority Data

Jun. 17, 1997 (JP) .................................................... 9-160089

(51) Int. Cl.[7] .................................................. H01L 27/108
(52) U.S. Cl. ............................................. 257/306; 257/773
(58) Field of Search ..................................... 257/306, 773

(56) References Cited

U.S. PATENT DOCUMENTS 6,066,871 * 5/2000 Ema ...................... 257/306

FOREIGN PATENT DOCUMENTS

| 2-151053 | 6/1990 | (JP) | H01L/21/90 |
| 5-110027 | 4/1993 | (JP) | H01L/27/108 |

* cited by examiner

Primary Examiner—Mark V. Prenty
(74) Attorney, Agent, or Firm—Sughrue, Mion, Zinn, Macpeak & Seas, PLLC

(57) ABSTRACT

A semiconductor device of the present invention has a base step area based on the step of a stacked capacitor array and has wiring layers formed over the stacked capacitors. A wiring layer arranged at the far most end part of the base step area is formed to detour the step area and the other wiring layers are arranged on the base step area.

18 Claims, 6 Drawing Sheets

SEMICONDUCTOR DEVICE HAVING WIRING DETOUR AROUND STEP

BACKGROUND OF THE INVENTION

1. Field of the Invention

The present invention relates to a semiconductor device, and more particularly to the formation of a wiring layer of a semiconductor device having a large base step in the layers under the wiring layers.

2. The Related Art

A semiconductor element which constitutes a semiconductor device is miniaturized and increased in density so as to heighten the integration of the semiconductor device. The formation of a multilayer wiring layer is an important technique for the higher integration of the semiconductor device. In particular, the formation of the multilayer wiring is becoming an important factor which affects the yield of good semiconductor devices. This affect occurs due to an unevenness of an interlayer insulating film on which the wiring layer formed. The unevenness of the interlayer insulating film is becoming very large making it difficult to control for the formation of the wiring layer in the photolithography process and in the dry etching process. Such unevenness of the interlayer insulating film results from a large base step of layers below the interlayer insulating film.

The base step under wiring layers has become quite remarkable in DRAMs of recent years because a DRAM memory cell typically has a stacked capacitor structure, and the height of a memory cell storage capacitor storage electrode and plate electrode increases with an increase in the volume of DRAM.

Conventional examples of the aforementioned DRAM will be explained by referring to FIGS. 5 and 6 which show an example in which a wiring layer is arranged on memory cells having stacked capacitors (hereinafter referred to as a first conventional example). Here, FIG. 5 is a plane view showing a corner part of memory cell array region. FIG. 6 is a sectional view of the memory cell region lined by II-II' of FIG. 5.

As shown in FIG. 5, the memory cell information storage electrode patterns 101a, 101b, 101c, 101d, 101e and 101f are formed in a matrix configuration. These memory cell capacitor storage electrode patterns are formed in a corner part area of a memory cell array of the DRAM. Then, a cell plate 102 is formed on the capacity insulating film 110 which will be described later. Furthermore, wiring layers 103a, 103b, 103c, 103d, 103e, 103f and the like are formed over a peripheral area and the memory cell array portion of the memory device on the interlayer insulating film 111. Here, as will be explained later, steps are formed between such memory cell array portion and the peripheral area surrounding the memory cell array portion.

As shown in FIG. 6, a field oxide film 105 is selectively formed on a surface of a P-type conductive type silicon substrate 104. Then a diffusion layer 106 having an N-type conductive type is formed on the surface of the silicon substrate 104. A first interlayer insulating film 107 covers the overall surface of the silicon substrate. Next, in a predetermined area, a contact hole 108 is provided which reaches the diffusion layer 106.

Then the memory cell capacitor information storage electrode 109, as a lower electrode, is connected to the diffusion layer 106 through the contact hole 108. On the surface of the memory cell capacitor information storage electrode 109 and on the surface of the interlayer insulating film 107, the capacitor insulating film 110 is formed. Furthermore, the cell plate 102, as an upper electrode of the memory cell capacitor, is formed on the capacitor insulating film 110. A second insulating film 111 covers the overall surface of the cell plate 102. Here, with an increase in the capacity of the DRAM the planar size of the memory cell capacitor information storage electrodes 101a, 101b, 101c, 101e, 101f, and the like, are reduced so that the height of the electrode 109 needs to be increased to ensure a predetermined storage capacitance value. As shown in FIG. 6, a large base step height is formed in the memory call device at the outside portion of the memory cell array area abutting the peripheral area surrounding the memory cell array area.

Then the second interlayer insulating film 111 is smoothed by means of heat treatment or the like. Furthermore, the metal film deposited on the second interlayer insulating film 111 is dry etched in patterns with a resist mask 112 which is formed using a photolithography process to form a wiring layer 103.

However, as shown in FIG. 7, when the base step height becomes large, a metal residual 113 remains between wiring layers, or in a space of wires. That is, this metal residual 113 is formed at the bend in the leg of a base step on the surface of the second interlayer insulating film 111 and causes a short circuit. The second interlayer insulating film 111 is steep and the film thickness of the wiring layer 103 at a step portion, labeled a, becomes, for example, two times or more as thick as the film thickness at the flat portion, labeled b, in FIG. 6. In the same manner, the film thickness at the step portion, labeled c, of the resist mask 112 becomes large as compared with the resist mask thickness at the flat portion, labeled d, as shown in FIG. 6.

On the other hand, if a long etching time is used to completely etch and remove the area of a large film thickness at the portion a by the dry etching process of the metal film 103, the etching time for the wiring layer 103 at the flat portion b becomes longer than required with the result that the wiring layers in the flat area are over-etched, for example, side etched such that layer 111 is etched undesirably. Furthermore, after formation of the resist mask 112 during the photolithography process, a long exposure time is required to completely remove the area c due to its large film thickness. However, the exposure time at the flat part d with a small film thickness is so long that the pattern width of the resist mask in the flat area becomes smaller.

A method for solving such problems as illustrated for the first conventional example will be explained hereinbelow. One such technique is described as the second conventional example while referring to FIGS. 8 and 9. FIG. 8 is a plane view showing a corner portion of a memory cell array and a peripheral area located adjacent to and the memory cell array area. FIG. 9 is a sectional view showing a stacked capacitor part for a cross section taken at line III-III'. Here, the same parts explained in the first conventional example are denoted by the same reference numerals.

In the same manner as the first conventional example, as shown in FIG. 8, the memory cell storage capacitor information storage electrode patterns 101a, 101b, 101c, 101d, 101e, 101f and the like are formed in a matrix configuration. Then, a cell plate 114 (storage capacitor second electrode) is formed on the capacitor insulating film 110. Furthermore, the wiring layers 103a, 103b, 103c, 103d, 103e, 103f are arranged on such memory cell part so as to run on the peripheral area of the memory cell area. Here, on the cell plate 114 a projecting parts 114a and 114b are formed in a definite cycle. Such projecting parts which are formed in a definite cycle provide an advantage which will be described later.

In the same manner as the first conventional example, a field oxide film 105 is formed on the surface of the silicon substrate shown in FIG. 9. Then, the diffusion layer 106 is formed on the surface of the silicon substrate 104, and an overall surface of the silicon substrate is covered with the first interlayer insulating film 107. Furthermore, a contact hole 108 is provided which reaches a definite area of the diffusion layer 106.

Furthermore, a memory cell storage capacitor information storage electrode 109 connected to the diffusion layer 106 via the aforementioned contact hole 108 is provided. Then, on the surface of the information storage electrode 109 and on the surface of the first interlayer insulating film 107, a capacitor insulating film 110 is formed. Furthermore, the cell plate 114 is formed on the capacitor insulating film 110, and an overall surface of the cell plate 114 is covered with the second interlayer insulating film 111. The second interlayer insulating film 111 is then smoothed with heat treatment. Furthermore, a metal film is deposited on the smoothed second interlayer insulating film 103 and dry etched in patterns with the resist mask so that the wiring layer 103 is formed.

The projecting part 114a of the cell plate 114 smoothes an inclination of the surface of the second interlayer insulating film 111 at the step. Then, when the wiring layer 103 is formed, the generation of the metal residual between the wiring layers as explained in the first conventional example, in this case, between the wiring layers 103c and 103d is almost prevented. Furthermore, the projecting parts 114a and 114b of the cell plate also smooth an inclination of the surface of the second interlayer insulating film 111 on the area sandwiched between these projecting parts 114a and 114b. As a consequence, the wiring layers 103e and 103f shown in FIG. 8 are arranged without the formation of the metal residual between the wiring layers 103e and 103f.

However, this conventional technique has the following problems. The problem which was discussed with reference to the first conventional example still occurs in the corner part area of the memory cell portion of the second conventional example. In other words, as illustrated in FIGS. 8 and 9, the wiring layer 103a arranged at the far most ends (four corners) of the memory cell array, i.e., the corner area of the memory cell array, the inclination angle and the step height part of the surface of the second interlayer insulating film 111 still remains large. As a consequence, accurately forming the wiring layer 103a arranged on the far most end of the memory cell array is difficult. For example, a short-cut is produced between the wirings 103a and 103b. Such problem becomes apparent along with increased planar area reduction of the design size of the semiconductor device and the memory cell of the memory cell array.

SUMMARY OF THE INVENTION

It is therefore an object of the present invention to enable a stable and accurate formation of the wiring layer arranged near the corners of the far most end portions of the memory cell array having a larger base step height.

A semiconductor device of the present invention comprises: a semiconductor substrate; an insulating film formed over the semiconductor substrate, the insulating film having a first portion and a second portion surrounding at least a part of the first portion, the first portion formed at an upper surface and the second portion formed at a lower surface lower, said lower surface being lower than the upper surface; a first wiring layer formed over the upper surface and the lower surface of the insulating film, and a second wiring layer formed only over the lower surface of the insulating film.

BRIEF DESCRIPTION OF THE DRAWINGS

The above and other objects, advantages, and features of the present invention will be more apparent from the following description taken in conjunction with the accompanying drawings, in which.

DETAILED DESCRIPTION OF THE PREFERRED EMBODIMENTS

Figure 1:
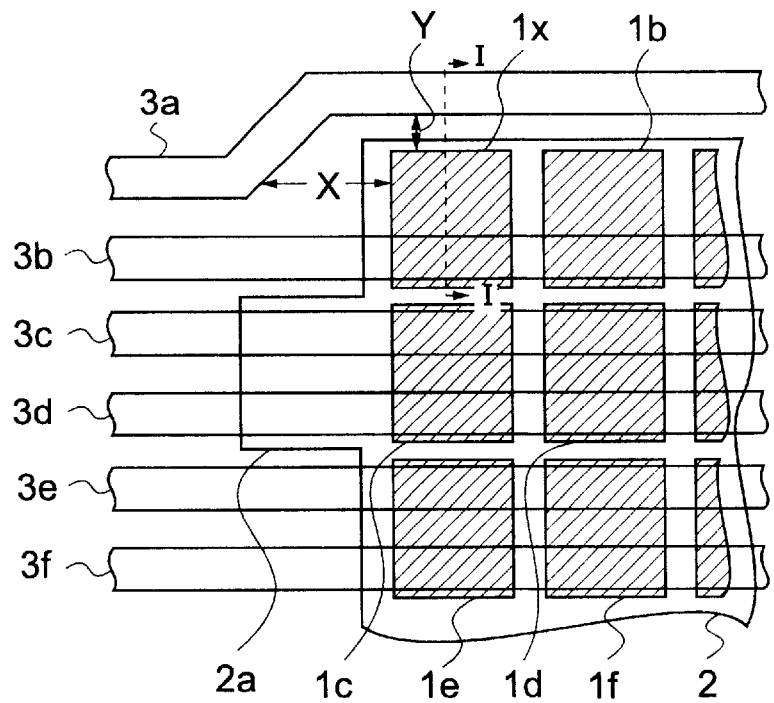
FIG. 1 is a plane view of a corner portion of a memory cell array of an embodiment of the present invention.
Figure 2:
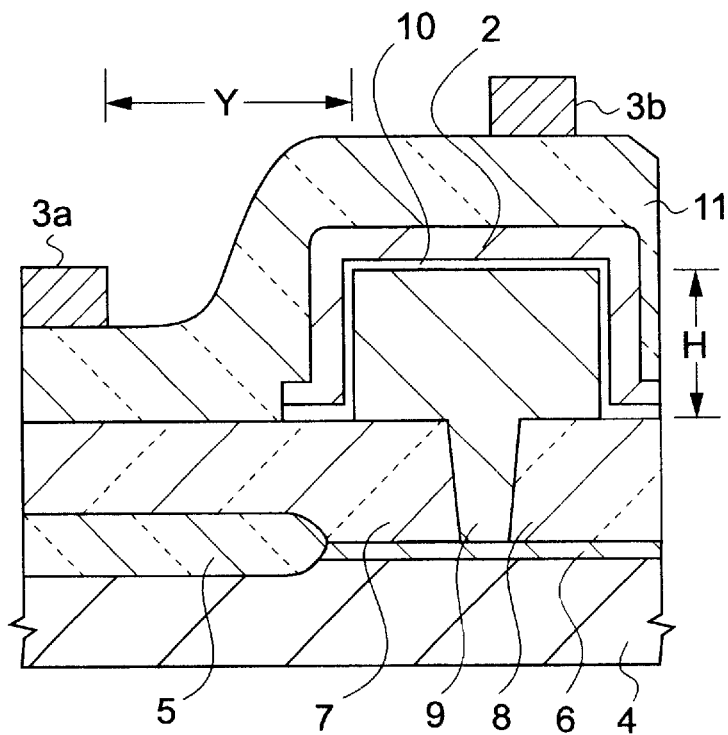
FIG. 2 is a sectional view of the corner portion of the memory cell array taken at line I-I' in FIG. 1 of the embodiment of the present invention.

An embodiment of the present invention is explained on the basis of FIGS. 1 and 2. FIG. 1 shows a memory device having wiring layers arranged over memory cells having respective stacked capacitors. FIG. 2 is a sectional view of the memory device taken at line I-I' in FIG. 1.

As shown in FIG. 2, the wiring layer 3a is arranged in such a manner that the wiring layer 3a makes a detour around the base step portion formed by the memory cell capacitor information storage electrode 9. Then, the distance (hereinafter referred to as a separation distance) between the electrode 9 and the wiring layer 3a is set to Y. Furthermore, the height of the electrode 9 is set to H (hereinafter referred to as a base step height H). Here, since the planar size of the information storage electrode patterns 1a, 1b, 1c, 1d, 1e, 1f and the like is decreased along with an increase in the capacity of the DRAM (number of memory cells), an increase in the base step height H is required to ensure the require predetermined capacitance value for the memory cell storage capacitor is properly achieved.

Prior to the formation of the wiring layer 3a, the second interlayer insulating film 11 is smoothed in advance with heat treatment. Then, a metal layer deposited on the second interlayer insulating film 11 is dry etched with a patterned resist mask formed in the photolithography process.

In such a manner, in the case where the wiring layer 3a on the far most end portion is formed on the lower part surface of the interlayer insulating film 11 so as to detour the base step portion at the corner of the memory cell array. The distance for detour of wiring layer 3a strongly depends on the magnitude of the base step height. This is explained with respect to FIG. 3. Here, the relation between the separation distance Y and the base step height H is based on experiment results. Incidentally, the wiring layer is formed of, for example, tungsten having a thickness of, for example, 0.5 μm, and a space between adjacent wiring layers and the line width of each wiring layers are both, for example, 0.4 μm.

Figure 3:
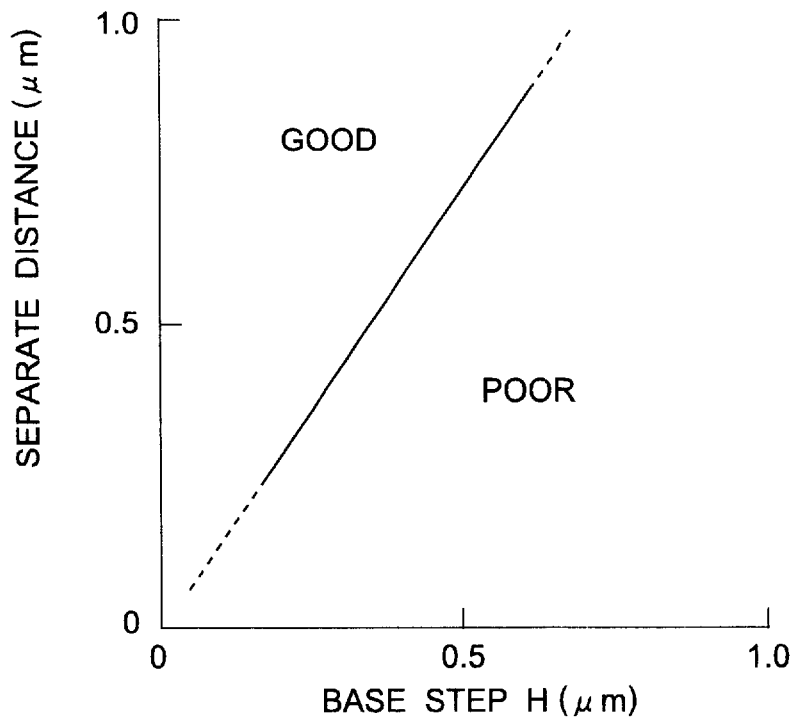
FIG. 3 is a graph showing a relation of a distance between a base step and a wiring layer for explaining the effect of the embodiment of the invention.

The relationship between the separation distance Y and the base step height H shown in FIG. 3, is approximately Y=3/2H.

As apparent from FIG. 3, when the separation distance Y is more than 1.5 times the thickness of the base step, the wiring layer becomes such that a good product can be consistently made. When the separation distance Y is less than that, the wiring layer becomes such that a poor product is more likely to be created. Here, a good product has no short circuits between wiring layers, particularly between the wiring layers 3a and 3b, and a disuniformity in the line width of the wiring layer is not more than +/−10% of the designed width. However, the relationship between the separation distance Y and the base step height H does not depend on the width of the wiring layer or the space between adjacent wires being at 0.5 μm.

Incidentally, to decrease a disuniformity of the line width of the wiring layer in the present invention, it becomes particularly important to control the pattern configuration of the resist mask of the wiring layer 3a which detours the memory cell portion. This is because reflection light is generated on the inclined surface formed at the edge of the base step in the photolithography exposure process, and a dent or imperfection in the pattern of the resist is likely to be generated.

Figure 4:
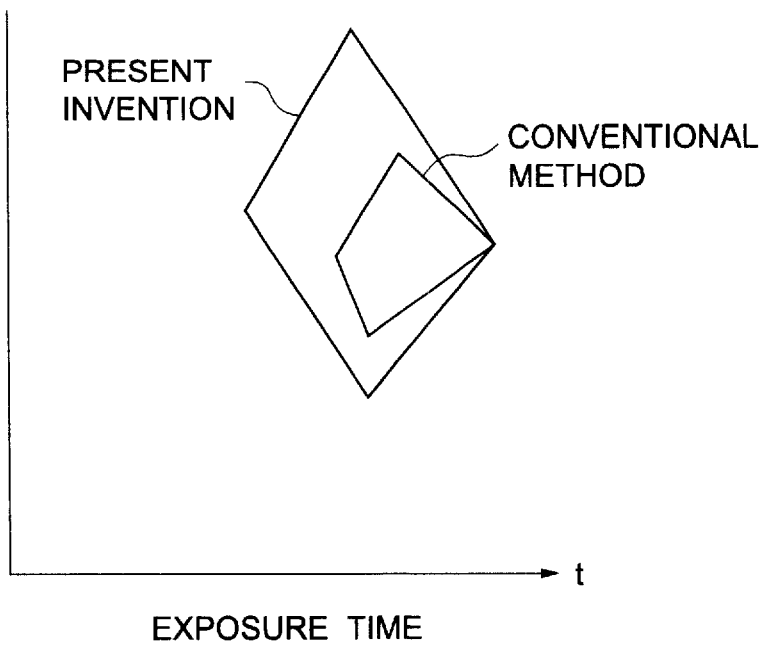
FIG. 4 is a view showing a condition scope of a light exposure process in a photolithography process for explaining an advantage of the present invention.
Figure 5:
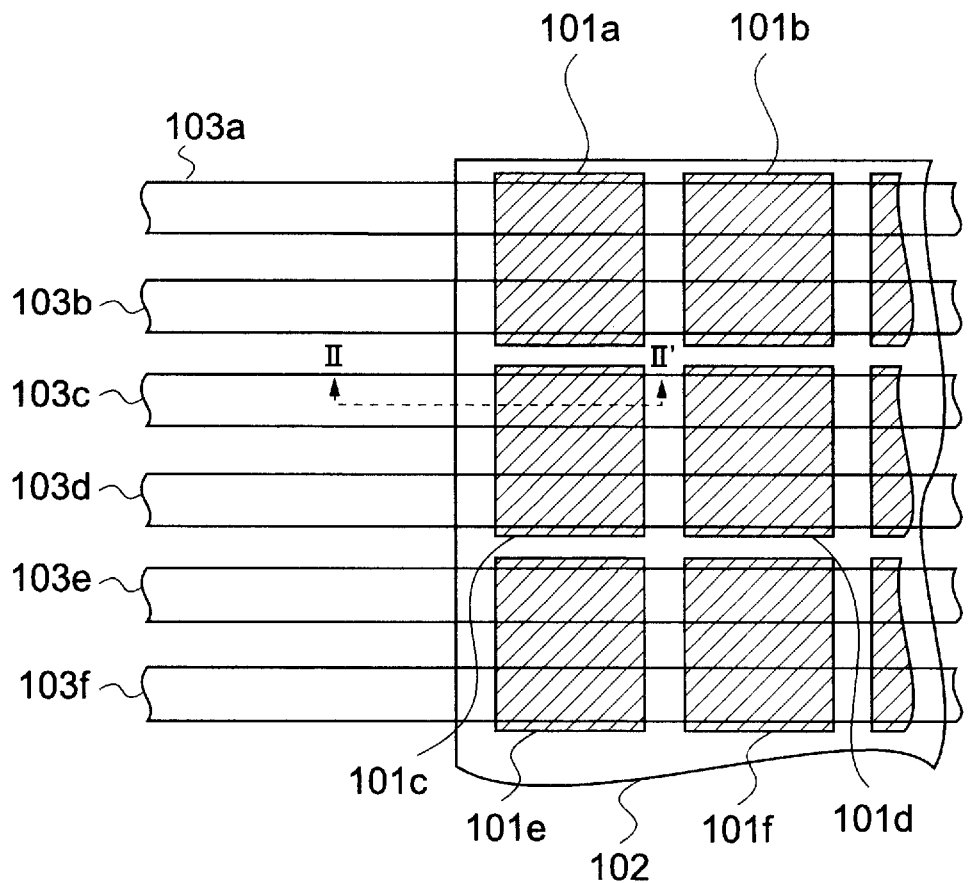
FIG. 5 is a plane view showing a corner portion of a memory cell array of a first conventional example.
Figure 6:
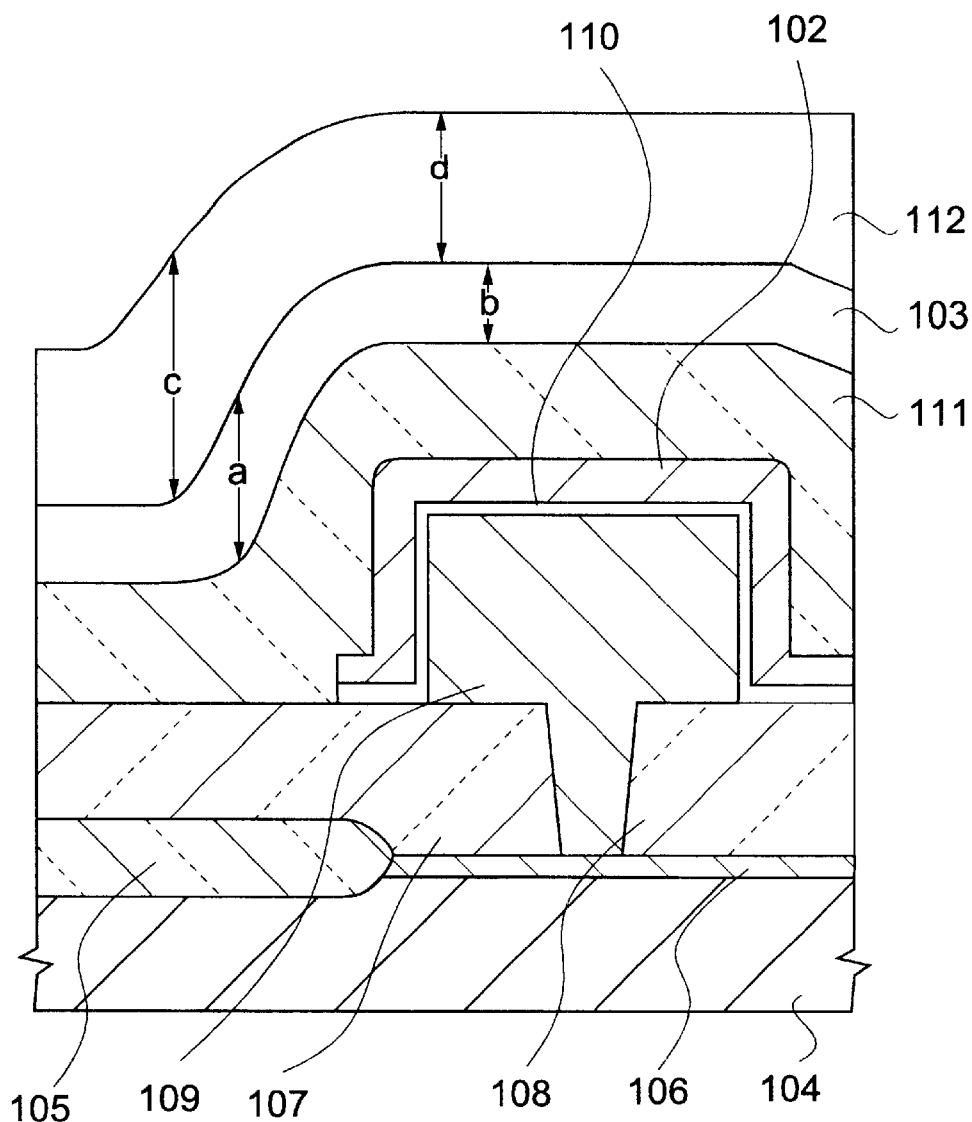
FIG. 6 is a sectional view of the memory cell portion taken at line II-II' in FIG. 5 of the first conventional example.
Figure 7:
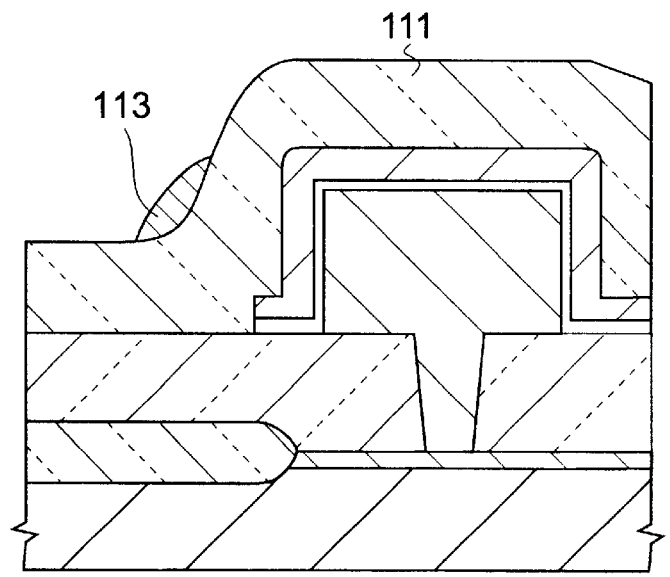
FIG. 7 is a sectional view of the corner portion of the memory cell array for explaining a problem in the first conventional example.
Figure 8:
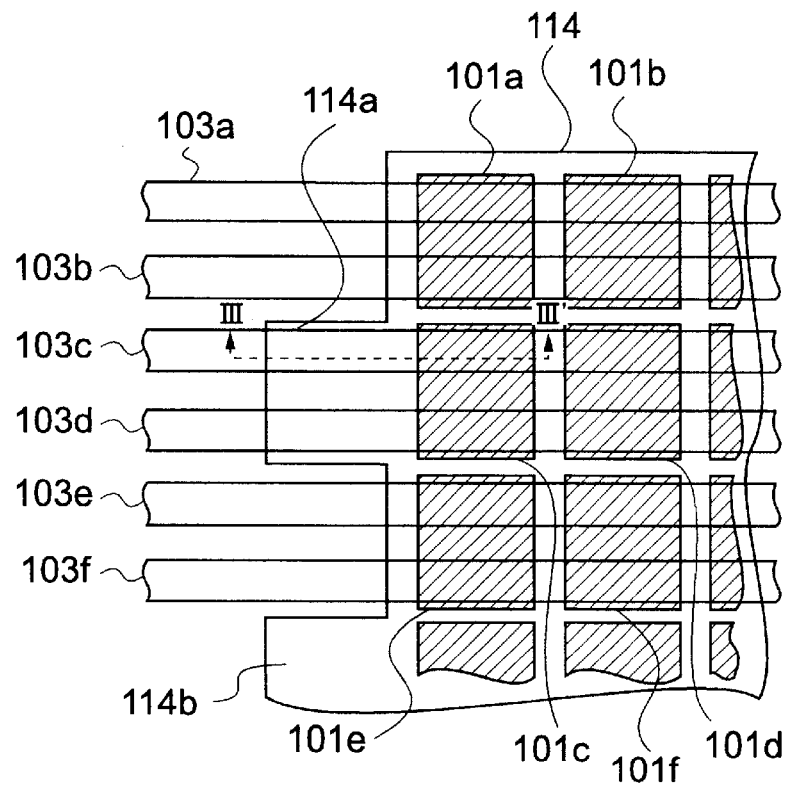
FIG. 8 is a plane view of the corner portion of the memory cell array of a second conventional example.
Figure 9:
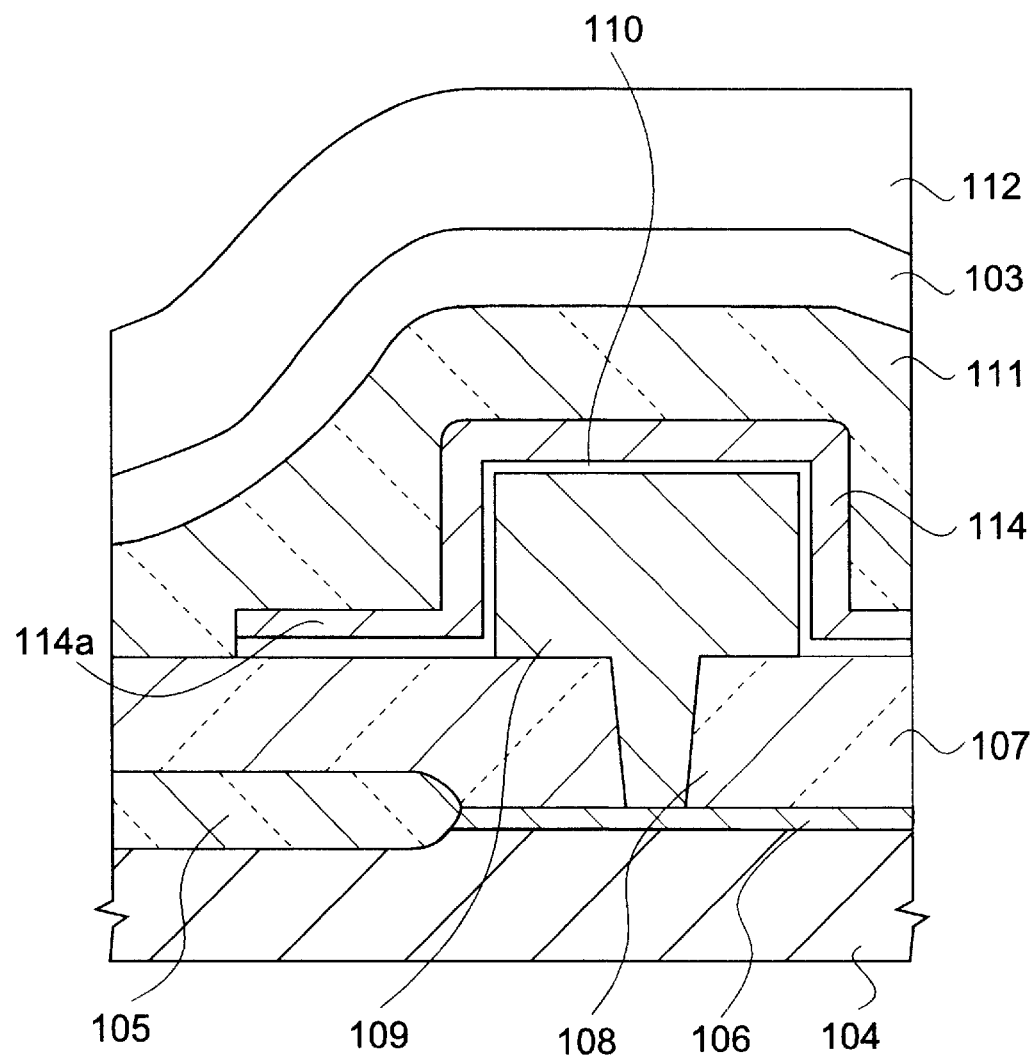
FIG. 9 is a sectional view of the corner portion of the memory cell array taken at line III-III' in FIG. 8 of the second conventional example.

In the method of the present invention as described above, as shown in FIG. 4, the acceptable range of exposure time and focus in the photolithography process for forming the wiring layer is greatly expanded. In other words, the acceptable range exposure is about twice that of the conventional method. In FIG. 4, the coordinate shows exposure time while the abscissa shows the focus scope of exposure, or the focus off-set amount. For example, in the pattern of the wiring layer, when the line width is set to 0.4 μm while the space is set to 0.4 μm, then the permitted scope of time and focus of exposure is largely expanded for the photolithography process, the yield of the semiconductor device is improved, and the manufacturing cost thereof will be decreased.

In the aforementioned embodiment, the wiring layers are made of, for example, tungsten. However, the same advantage will be provided even when the wiring layers are formed of another metal, silicide or polysilicon. The wiring layers 3a through 3f are, for example, bit lines. On the other hand, layers 3a through 3f may be word lines.

As described above, in the case where a wiring layer is formed in an area having a base step, such as a corner portion of a memory cell array of the DRAM, the wiring layer is arranged so as to detour the base step. The distance of the detour may be set to about 1.5 times or more of the value of the base step. In this manner, even when the semiconductor device is highly integrated and the wiring structure is miniaturized, the generation of failures, such as from wiring imperfections, such as the short-circuit of the wiring layer at the base step part or disconnection (an open line) of the metal layers interconnect can be easily prevented. Furthermore, the photolithogpaphy patterning of the wiring layer can be made easy and the manufacturing cost is largely decreased.

In this manner, the wiring layer, arranged at a far most end portion of the memory cell array area in which the base step height is enlarge, can be formed in an accurate, repeatable and stable manner in the manufacturing process of the semiconductor device. Even when the semiconductor device is miniaturized, a high yield of good semiconductor devices can be obtained.

It is apparent from the specification that the present invention is not limited to the above embodiments but may be modified and changed without departing from the scope and spirit of the invention. For example, this technique of forming a detour of a metal runner at a far end of a circuit portion having a significant base step height can be used for improving the formation of any wiring layer in semiconductor devices. However, it is particularly well suited for those areas of a base step height at a corner portion with a base step heights differential in both X and Y directions (when viewed from a planar perspective of the semiconductor device).

What is claimed is:

1. A semiconductor device comprising:

a semiconductor substrate;

an insulating film formed over said semiconductor substrate, said insulating film having a first portion and a second portion surrounding at least a part of said first portion, said first portion having a first surface and said second portion having a second surface lower than said first surface;

a first wiring layer formed over said first surface and said second surface of said insulating film; and a second wiring layer formed only over said second surface of said insulating film, wherein said second wiring layer detours around said first surface.

2. The device as claimed in claim 1, wherein said first portion of said insulating film is a memory cell array portion and said second portion of said insulating film is a peripheral portion of a memory cell device.

3. The device as claimed in claim 2, wherein said first and second wiring layers are formed from the same material.

4. The device as claimed in claim 3, wherein said first and second wiring layers are formed from tungsten.

5. The device as claimed in claim 2, further comprising a memory cell capacitor information storage electrode overlapped by said first wiring layer.

6. The device as claimed in claim 5, wherein a distance between said second wiring layer and said memory cell capacitor information storage electrode is at least 1.5 times the height distance between said first surface and said second surface of said insulating film.

7. A semiconductor device comprising:

a semiconductor substrate having a first portion extending in a direction and a second portion coupled to said first portion, said second portion extending in said direction;

a plurality of memory cell capacitor information storage electrodes arranged over said first portion;

a first wiring layer extending in said direction and formed over said memory cell capacitor information storage electrodes;

a second wiring layer having a first part, a second part and a third part, said first part formed over said first portion of said semiconductor substrate and extending in said direction, a second part formed over said second portion of said semiconductor substrate and extending in said direction, and said third part connected between said first and second parts, said third part running in a different direction.

8. The device as claimed in claim 7, wherein said second wiring layer detours said plurality of memory cell capacitor information storage electrodes.

9. The device as claimed in claim 8, wherein said first portion includes a memory cell array portion and said second portion is a peripheral portion of said memory cell array portion adjacent to said memory cell array portion.

10. The device as claimed in claim 9, wherein said second wiring layer detours a corner of said memory cell array portions so as to avoid a large base step height caused by a thick height of stacked memory cell capacitors.

11. The device as claimed in claim 10, wherein said first and second wiring layers are formed from the same material.

12. The device as claimed in claim 11, wherein said first and second wiring layers are formed from tungsten.

13. The device as claimed in claim 12, wherein the distance between said second wiring layer and said one side of memory cell array portion is at least 1.5 times the thickness of said memory cell capacitor information storage electrode in said memory cell array portion.

14. A semiconductor device comprising:

a plurality of memory cell capacitor information storage electrodes arranged in a matrix so that at least a first group consisting of said memory cell capacitor information storage electrodes arranged at an end of said matrix in a row direction and a second group consisting of said memory cell capacitor information storage electrodes arranged different from said first group in said row direction are arranged;

a cell plate formed over said memory cell capacitor information storage electrodes, said cell plate having a projecting portion from said cell plate around an end of said second group;

first and second wiring layers overlapping said second group and said projecting portion of said cell plate, said first and second wiring layers running in said row direction;

a third wiring layer overlapping said first group and running in said row direction; said third wiring layer adjacent to said one of said first and second wiring layers, and a fourth wiring layer being far from said first and second wiring layers compared with said third wiring, said fourth wiring layer having a first portion and a second portion, said first portion existing in said row direction from said first group and said second portion existing in a column direction from said first group, a distance between said first wiring layer at said first portion and said second wiring layer in said column direction being same to a distance between said third and fourth wiring layers in said column direction, and a distance between said first wiring at said second portion and said second wiring layer in said column direction being different from a distance between said third and fourth wiring layers in said column direction.

15. The device as claimed in claim 14, wherein said second wiring layer detours said plurality of memory cell capacitor information storage electrodes.

16. The device as claimed in claim 14, wherein said fourth wiring layer detours said memory cell capacitor information storage electrodes so as to avoid a large base step height caused by a thick height of stacked memory cell capacitors.

17. The device as claimed in claim 14, wherein said first and second wiring layers are formed from the same material.

18. The device as claimed in claim 14, wherein the distance between said fourth wiring layer and said one side of said memory cell capacitor information storage electrode is at least 1.5 times the thickness of said memory cell capacitor information storage electrode.

* * * * *